United States Patent
Matsuura (10) Patent No.: US 8,787,431 B2
(45) Date of Patent: Jul. 22, 2014

(54) TRANSMITTER AND COMMUNICATION DEVICE

(75) Inventor: Toru Matsuura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/142,621

(22) PCT Filed: Oct. 27, 2010

(86) PCT No.: PCT/JP2010/006351
§ 371 (c)(1),
(2), (4) Date: Jun. 29, 2011

(87) PCT Pub. No.: WO2011/058709
PCT Pub. Date: May 19, 2011

(65) Prior Publication Data
US 2012/0243582 A1   Sep. 27, 2012

(30) Foreign Application Priority Data

Nov. 10, 2009   (JP) .................................. 2009-257077

(51) Int. Cl.
*H04L 25/49* (2006.01)
(52) U.S. Cl.
USPC ............................ 375/219; 375/296; 375/295
(58) Field of Classification Search
CPC ................................... H04B 1/0475
USPC .......................... 375/219, 296, 295
See application file for complete search history.

(56) References Cited

U.S. PATENT DOCUMENTS

| 6,078,628 A | 6/2000 | Griffith et al. |
| 6,127,884 A * | 10/2000 | Rishi .............................. 329/304 |
| 6,587,513 B1 * | 7/2003 | Ichihara ........................ 375/296 |
| 7,944,295 B2 * | 5/2011 | Hongo et al. ................. 330/149 |
| 8,059,748 B2 * | 11/2011 | See et al. ....................... 375/296 |
| 2004/0071225 A1 * | 4/2004 | Suzuki et al. ................. 375/297 |
| 2007/0147541 A1 | 6/2007 | Saito |
| 2008/0197925 A1 * | 8/2008 | Furuta et al. .................. 330/149 |
| 2010/0019840 A1 | 1/2010 | Takahashi |

FOREIGN PATENT DOCUMENTS

| JP | 2005-286995 | 10/2005 |
| WO | 2008/090721 | 7/2008 |

OTHER PUBLICATIONS

International Search Report issued Nov. 22, 2010 in corresponding International Application No. PCT/JP2010/006351.

* cited by examiner

*Primary Examiner* — Michael Neff
(74) *Attorney, Agent, or Firm* — Wenderoth, Lind & Ponack, L.L.P.

(57) ABSTRACT

A transmitter compensates for AM/PM distortion and operates with low distortion and high efficiency. A compensation section calculates an amplitude signal M representing the magnitude of a vector consisting of $I_{PL}$ and $Q_{PL}$ signals which pass through LPFs, respectively, thereby predicting variation of the envelope of a radio frequency signal Pi, which variation occurs due to $I_p'$ and $Q_p'$ signals passing through LPFs, respectively. The compensation section calculates a phase compensation amount θcomp, based on the calculated amplitude signal M, and adds the phase compensation amount θcomp to a phase signal θ.

11 Claims, 10 Drawing Sheets

| MAGNITUDE OF ENVELOPE OF RADIO FREQUENCY SIGNAL Pi | RELATIVE PHASE TRANSITION Φ |
|---|---|
| Pi1 | Φ1 |
| Pi2 | Φ2 |
| Pi3 | Φ3 |
| ⋮ | ⋮ |
| Pin | Φn |

FIG. 3B

| MAGNITUDE OF AMPLITUDE SIGNAL M | COEFFICIENT θcomp0 |
|---|---|
| Pi1 | −Φ1 |
| Pi2 | −Φ2 |
| Pi3 | −Φ3 |
| ⋮ | ⋮ |
| Pin | −Φn |

| MAGNITUDE OF ENVELOPE OF RADIO FREQUENCY SIGNAL Pi | MAGNITUDE OF AMPLITUDE SIGNAL m | | | |
|---|---|---|---|---|
| | m1 | m2 | ... | ms |
| Pi1 | Φ11 | Φ12 | ... | Φ1s |
| Pi2 | Φ21 | Φ22 | ... | Φ2s |
| Pi3 | Φ31 | Φ32 | ... | Φ3s |
| ... | ... | ... | ... | ... |
| Pin | Φn1 | Φn2 | ... | Φns |

FIG. 6B

| MAGNITUDE OF AMPLITUDE SIGNAL M | MAGNITUDE OF AMPLITUDE SIGNAL m | | | |
|---|---|---|---|---|
| | m1 | m2 | ... | ms |
| Pi1 | −Φ11 | −Φ12 | ... | −Φ1s |
| Pi2 | −Φ21 | −Φ22 | ... | −Φ2s |
| Pi3 | −Φ31 | −Φ32 | ... | −Φ3s |
| ... | ... | ... | ... | ... |
| Pin | −Φn1 | −Φn2 | ... | −Φns |

TRANSMITTER AND COMMUNICATION DEVICE

BACKGROUND OF THE INVENTION

1. Technical Field

The present invention relates to a transmitter used in communication devices such as mobile phones and wireless LAN devices, and to a communication device. In particular, the present invention relates to a transmitter that can operate with low distortion and high efficiency, and to a communication device using the transmitter.

2. Background Art

It is required for communication devices such as mobile phones and wireless LAN devices to secure the precision of output signals and operate with low power consumption. A transmitter that can operate with low distortion and high efficiency is needed for such communication devices.

Figure 12:
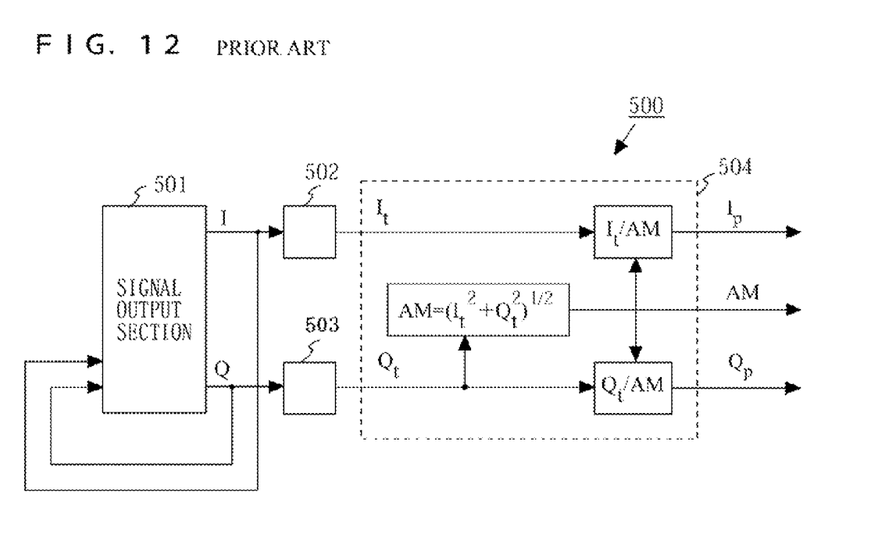
FIG. 12 is a block diagram showing the configuration of a signal generation section 500 used for a conventional transmitter.

FIG. 12 is a block diagram showing the configuration of a signal generation section 500 used for a conventional transmitter disclosed in Patent Literature 1. In FIG. 12, the conventional signal generation section 500 includes a signal output section 501, digital filters 502 and 503, and an ASIC (application specific integrated circuit) 504. The signal output section 501 outputs an I signal (in-phase signal) and a Q signal (quadrature phase signal). The I and Q signals are inputted to the digital filters 502 and 503, respectively. The digital filters 502 and 503 remove spurious components from the I and Q signals, and output the resultant signals as $I_t$ and $Q_t$ signals, respectively. The $I_t$ and $Q_t$ signals are inputted to the ASIC 504.

The ASIC 504 calculates an amplitude signal AM, based on the $I_t$ and $Q_t$ signals. Further, the ASIC 504 generates, by dividing the $I_t$ and $Q_t$ signals by the amplitude signal AM, $I_p$ and $Q_p$ signals which have been normalized. The ASIC 504 outputs the amplitude signal AM represented by (expression 1) and the $I_p$ and $Q_p$ signals represented by (expression 2).

[Expression 1]

$$AM=(I_t^2+Q_t^2)^{1/2} \quad \text{(expression 1)}$$

[Expression 2]

$$I_p=I_t/AM$$

$$Q_p=Q_t/AM \quad \text{(expression 2)}$$

Figure 13:
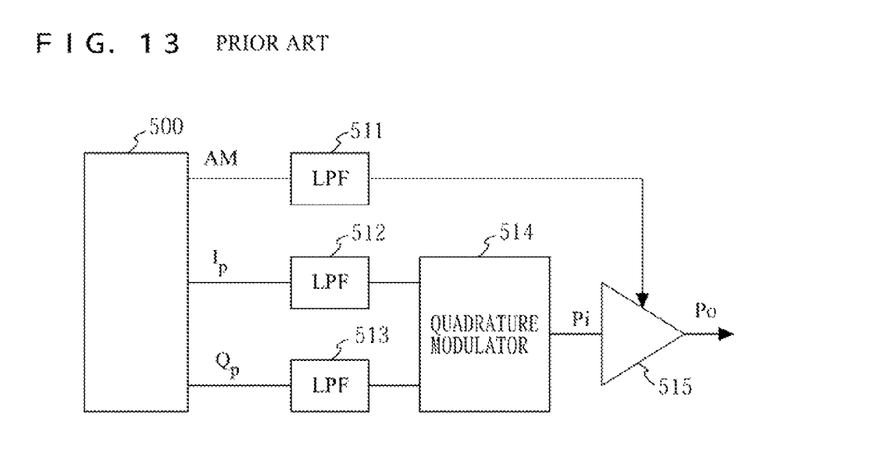
FIG. 13 is a block diagram showing the configuration of a conventional transmitter 510.

Although Patent Literature 1 does not disclose any example in which the signal generation section 500 is applied to a polar modulation circuit, it is also conceivable to apply the signal generation section 500 described above to a polar modulation circuit. Hereinafter, a polar modulation circuit to which the signal generation section 500 is applied is referred to as a conventional transmitter 510. It is conceivable to configure the conventional transmitter 510 as shown in FIG. 13. In FIG. 13, the conventional transmitter 510 includes the signal generation section 500, LPFs 511 to 513, a quadrature modulator 514, and an amplitude modulator 515.

As described above, the signal generation section 500 outputs an amplitude signal AM and normalized $I_p$ and $Q_p$ signals. The amplitude signal AM is inputted to the LPF 511. The LPF 511 removes a spurious component from the amplitude signal AM. The amplitude signal AM, from which the LPF 511 has removed a spurious component, is inputted to the amplitude modulator 515.

The $I_p$ and $Q_p$ signals are inputted to the LPFs 512 and 513, respectively. The LPFs 512 and 513 remove spurious components from the $I_p$ and $Q_p$ signals, respectively. To be specific, when the $I_p$ and $Q_p$ signals are digital signals, the LPFs 512 and 513 remove quantization noise from the $I_p$ and $Q_p$ signals, respectively. When the $I_p$ and $Q_p$ signals are analog signals, the LPFs 512 and 513 remove image signals from the $I_p$ and $Q_1$ signals, respectively.

The $I_p$ and $Q_p$ signals, from which the LPFs 512 and 513 have removed spurious components, are inputted to the quadrature modulator 514. The quadrature modulator 514 performs quadrature modulation on the $I_p$ and $Q_p$ signals inputted to the quadrature modulator 514 via the LPFs 512 and 513, and outputs a radio frequency signal Pi. The radio frequency signal Pi is inputted to the amplitude modulator 515. The amplitude modulator 515 performs amplitude modulation on the radio frequency signal Pi with the amplitude signal AM and outputs a transmission signal Po.

CITATION LIST

Patent Literature

[PTL 1] U.S. Pat. No. 6,078,628

SUMMARY OF THE INVENTION

Figure 14:
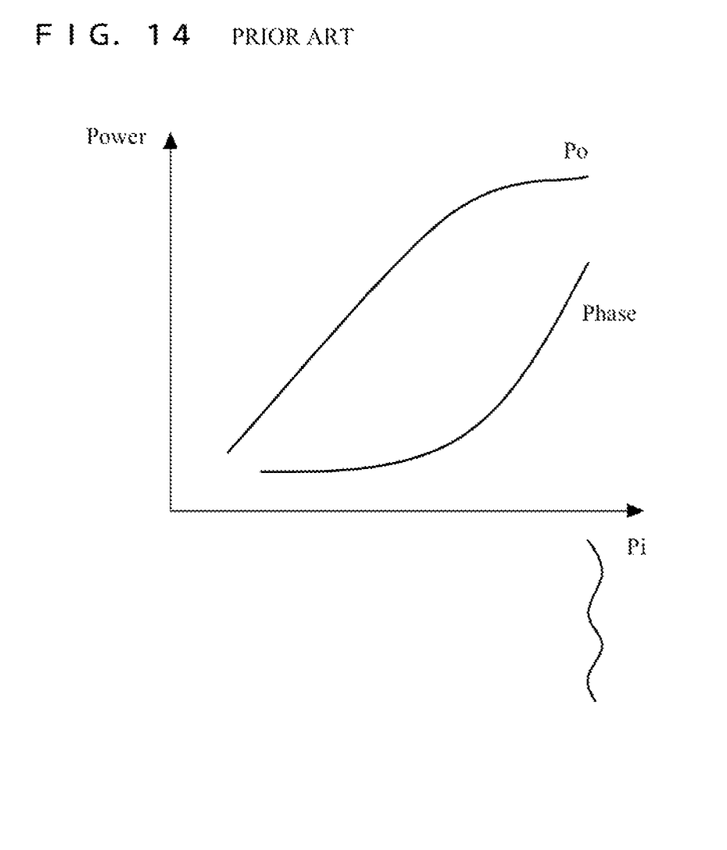
FIG. 14 shows the characteristics of the conventional transmitter 510.

In the transmitter 510, however, the $I_p$ and $Q_p$ signals pass through the LPFs 512 and 513, respectively. Therefore, high-frequency components of the $I_p$ and $Q_p$ signals might be lost depending on the cutoff frequencies of the LPFs 512 and 513, in which case the magnitude of a vector consisting of the $I_p$ and $Q_p$ signals varies after the $I_p$ and $Q_p$ signals pass through the LPFs 512 and 513. Consequently, as shown in FIG. 14, the envelope of the radio frequency signal Pi outputted by the quadrature modulator 514 varies, whereby the relative phase transition in the amplitude modulator 515 varies. Here, when a range in the linear region, in which range there is no phase difference, is defined as zero, the relative phase transition is defined by the amount of variation from zero in the non-linear region.

That is, as shown in FIG. 14, since in the conventional transmitter 510, the amplitude modulator 515 operates in the saturation region of the AM/AM characteristics and the AM/PM characteristics are also saturated in the saturation region of the AM/AM characteristics, the variation of the envelope of the radio frequency signal Pi causes AM/PM distortion in the amplitude modulator 515. Thus, the conventional transmitter 510 has a problem in that AM/PM distortion occurs in the amplitude modulator 515.

Therefore, an object of the present invention is to provide a transmitter capable of compensating for AM/PM distortion, solving the above conventional problem, and operating with low distortion and high efficiency, and to provide a communication device using the transmitter.

An object of the present invention is directed to a transmitter which outputs a transmission signal. In order to achieve the object, a transmitter according to the present invention includes: a signal generation section for performing predetermined signal conversion processing on an input signal, and generating first I and Q signals, a phase signal representing the phase component of the input signal, and a first amplitude signal representing the magnitude of the input signal; an IQ mapping section for converting the phase signal into second I and Q signals; a first LPF for removing a spurious component from the second I and Q signals; a quadrature modulator for performing quadrature modulation on the second I and Q signals inputted via the first LPF, and outputting a radio frequency signal; an amplitude modulator for performing amplitude modulation on the radio frequency signal with the first amplitude signal, and outputting the transmission signal; and a compensation section for compensating for AM/PM distortion contained in the transmission signal, based on the first I and Q signals. The compensation section includes: a second LPF having the same characteristics as those of the first LPF; an amplitude calculation section for calculating a second amplitude signal representing the magnitude of the first I and Q signals inputted via the second LPF; an LUT in which a coefficient corresponding to the magnitude of the second amplitude signal is stored in advance; a control section for reading, from the LUT, the coefficient corresponding to the magnitude of the second amplitude signal, and calculating, based on the read coefficient, a phase compensation amount corresponding to the second amplitude signal; and an adder for adding the phase compensation amount to the first phase signal.

The control section may read, from the LUT, a coefficient corresponding to a value near the magnitude of the second amplitude signal, and calculate the phase compensation amount corresponding to the second amplitude signal by interpolation from the read coefficient.

A coefficient which has a characteristic opposite to that of the relative phase transition in the amplitude modulator is stored in the LUT.

A coefficient which corresponds to the magnitude of the first amplitude signal and the magnitude of the second amplitude signal may be stored in the LUT. In this case, the control section reads, from the LUT, the coefficient corresponding to the magnitude of the first amplitude signal and the magnitude of the second amplitude signal, and calculates, based on the read coefficient, a phase compensation amount corresponding to the first amplitude signal and the second amplitude signal.

The control section may read, from the LUT, a coefficient corresponding to a value near the magnitude of the first amplitude signal and a value near the magnitude of the second amplitude signal, and calculate a phase compensation amount corresponding to the first amplitude signal and the second amplitude signal by interpolation from the read coefficient.

The signal generation section includes a first signal conversion section for converting the input signal into the phase signal and the first amplitude signal, and a second signal conversion section for converting the phase signal into the first I and Q signals. When the input signal is denoted by I and Q, the phase signal is denoted by $\theta$, the first I and Q signals are denoted by $I_p$ and $Q_p$, and the first amplitude signal is denoted by m, the relationships represented by the following expressions are satisfied among I, Q, $\theta$, $I_p$, $Q_p$, and m.

$$\theta = \arctan\left(\frac{Q}{I}\right)$$
$$I_p = \cos(\theta)$$
$$Q_p = \sin(\theta)$$
$$m = \sqrt{I^2 + Q^2}$$

Preferably, the transmitter further includes, between the quadrature modulator and the amplitude modulator, a limiter for suppressing variation of the envelope of the radio frequency signal.

Further, the present invention is also directed to a communication device including the transmitter described above. The communication device includes a transmitter for generating a transmission signal, and an antenna for outputting the transmission signal generated by the transmitter. The communication device may further include a reception circuit for processing a reception signal received from the antenna, and an antenna duplexer for outputting, to the antenna, the transmission signal generated by the transmitter, and outputting, to the reception circuit, the reception signal received from the antenna.

In the transmitter according to the present invention, the compensation section calculates the magnitude of a vector consisting of the $I_{PL}$ and $Q_{PL}$ signals which have passed through the second LPF (i.e., the amplitude signal M), thereby predicting variation of the envelope of the radio frequency signal Pi which is caused by the first LPF. Then, the compensation section calculates, based on the calculated amplitude signal M, a phase compensation amount $\theta$comp ($-\Phi$) for compensating for the relative phase transition $\Phi$ in the amplitude modulator, and adds the phase compensation amount $\theta$comp to the phase signal $\theta$. In this manner, the compensation section compensates for AM/PM distortion contained in the transmission signal Po. Therefore, the transmitter can operate with low distortion and high efficiency.

BRIEF DESCRIPTION OF THE DRAWINGS

FIG. 6A shows an example of values of the relative phase transition $\Phi$ in an amplitude modulator 17a.

FIG. 6B shows an example of coefficients $\theta$comp0 stored in an LUT 20a.

DETAILED DESCRIPTION OF THE INVENTION

First Embodiment

Figure 1:
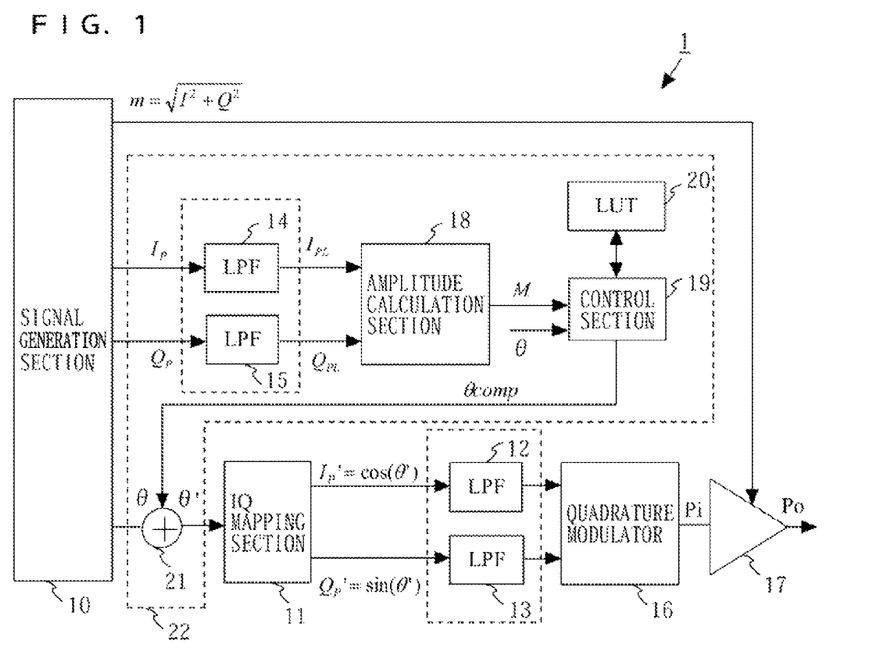
FIG. 1 is a block diagram showing an example of the configuration of a transmitter 1 according to a first embodiment of the present invention.

FIG. 1 is a block diagram showing an example of the configuration of a transmitter 1 according to a first embodiment of the present invention. In FIG. 1, the transmitter 1 includes a signal generation section 10, an IQ mapping section 11, LPFs (low-pass filters) 12 to 15, a quadrature modulator 16, an amplitude modulator 17, an amplitude calculation section 18, a control section 19, an LUT (look-up table) 20, and an adder 21. Among these components, the LPFs 14 and 15, the amplitude calculation section 18, the control section 19, the LUT 20, and the adder 21 are components for compensating for AM/PM distortion. Therefore, they can be collectively referred to as a compensation section 22.

The signal generation section 10 generates, based on an input signal, an amplitude signal m, $I_p$ and $Q_p$ signals, and a phase signal $\theta$. The input signal includes an I signal (in-phase signal) including an I component (in-phase component), and a Q signal (quadrature phase signal) including a Q component (quadrature phase component). The amplitude signal m can be represented by (expression 3). The $I_p$ and $Q_p$ signals can be represented by (expression 4). The phase signal $\theta$ can be represented by (expression 5).

[Expression 3]
$$m = \sqrt{I^2 + Q^2} \quad \text{(expression 3)}$$

[Expression 4]
$$I_p = \cos(\theta) \quad \text{(expression 4)}$$
$$Q_p = \sin(\theta)$$

[Expression 5]
$$\theta = \arctan\left(\frac{Q}{I}\right) \quad \text{(expression 5)}$$

Figure 2:
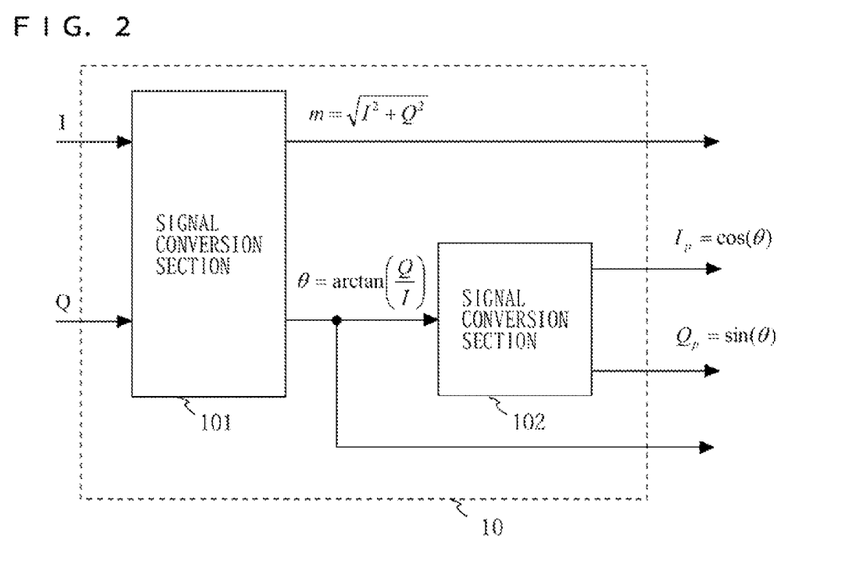
FIG. 2 is a block diagram showing in detail an example of the configuration of a signal generation section 10.

FIG. 2 is a block diagram showing in detail an example of the configuration of the signal generation section 10. In FIG. 2, the signal generation section 10 includes signal conversion sections 101 and 102. The signal conversion section 101 converts I and Q signals into an amplitude signal m which represents the magnitude of the I and Q signals, and a phase signal $\theta$ which represents the phase component of the I and Q signals, the amplitude signal m and the phase signal $\theta$ each being a polar coordinate signal. The amplitude signal m can be represented by (expression 3) described above. The phase signal $\theta$ can be represented by (expression 5) described above. The signal conversion section 102 converts the phase signal $\theta$ into an $I_p$ signal including an I component, and a $Q_p$ signal including a Q component. The $I_p$ and $Q_p$ signals can be represented by (expression 4) described above.

The phase signal $\theta$ outputted from the signal generation section 10 is inputted to the adder 21. The adder 21 adds, to the phase signal $\theta$, an output signal $\theta$comp from the control section 19, and outputs a phase signal $\theta'$. The phase signal $\theta'$ can be represented by (expression 6). The operation of the control section 19 will be described in detail later.

[Expression 6]
$$\theta' = \theta + \theta\text{comp} \quad \text{(expression 6)}$$

The IQ mapping section 11 converts the phase signal $\theta'$ into an $I_p'$ signal including an I component, and a $Q_p'$ signal including a Q component. The $I_p'$ and $Q_p'$ signals can be represented by (expression 7).

[Expression 7]
$$I_p' = \cos(\theta')$$
$$Q_p' = \sin(\theta') \quad \text{(expression 7)}$$

The $I_p'$ and $Q_p'$ signals are inputted to the LPFs 12 and 13, respectively. The LPFs 12 and 13 band-limit the $I_p'$ and $Q_p'$ signals with predetermined cut-off frequencies, and remove spurious components from the $I_p'$ and $Q_p'$ signals, respectively. To be specific, when the $I_p'$ and $Q_p'$ signals are digital signals, the LPFs 12 and 13 remove quantization noise from the $I_p'$ and $Q_p'$ signals, respectively. When the $I_p'$ and $Q_p'$ signals are analog signals obtained as a result of DA conversion, the LPFs 12 and 13 remove image signals, which are higher harmonics resulting from the DA conversion, from the $I_p'$ and $Q_p'$ signals, respectively. It should be noted that the LPFs 12 and 13 have the same characteristics. This is because the $I_p'$ and $Q_p'$ signals have the same properties except that they am orthogonal to each other. Therefore, the LPFs 12 and 13 may be configured as a single filter.

The $I_p'$ and $Q_p'$ signals, from which the LPFs 12 and 13 have removed spurious components, are inputted to the quadrature modulator 16. The quadrature modulator 16 performs quadrature modulation on the $I_p'$ and $Q_p'$ signals inputted via the LPFs 12 and 13, and outputs a radio frequency signal Pi. The radio frequency signal Pi is inputted to the amplitude modulator 17. The amplitude modulator 17 performs amplitude modulation on the radio frequency signal Pi with the amplitude signal m, and outputs a transmission signal Po.

Since the $I_p'$ and $Q_p'$ signals, which are inputted to the quadrature modulator 16, pass through the LPFs 12 and 13, high-frequency components of the $I_p'$ and $Q_p'$ signals are suppressed, and therefore the magnitude of a vector consisting of the $I_p'$ and $Q_p'$ signals varies after the $I_p'$ and $Q_p'$ signals pass through the LPFs 12 and 13. Consequently, as shown in FIG. 14, the envelope of the radio frequency signal Pi outputted by the quadrature modulator 16 varies, whereby the relative phase transition in the amplitude modulator 17 varies. Here, when a range in the linear region, in which range there is no phase difference, is defined as zero, the relative phase transition is defined by the amount of variation from zero in the non-linear region. When the relative phase transition is defined as $\Phi$, the transmission signal Po outputted by the amplitude modulator 17 would contain AM/PM distortion of $\Phi$ if the compensation section 22 did not operate.

The compensation section 22 predicts the variation of the envelope of the radio frequency signal Pi which occurs due to the $I_p'$ and $Q_p'$ signals passing through the LPFs 12 and 13. Further, the compensation section 22 compensates for AM/PM distortion contained in the transmission signal Po, based on the predicted variation of the envelope. The operation of the compensation section 22 will be described below.

In the compensation section 22, the LPFs 14 and 15 have the same characteristics as those of the LPFs 12 and 13. This is in order to predict, by means of the LPFs 14 and 15, the variation of the envelope of the radio frequency signal Pi which occurs due to the $I_p'$ and $Q_p'$ signals passing through the LPFs 12 and 13. The $I_p$ and $Q_p$ signals are inputted from the signal generation section 10 to the LPFs 14 and 15, respectively. The LPFs 14 and 15 band-limit the $I_p$ and $Q_p$ signals with predetermined cut-off frequencies, and outputs $I_{PL}$ and $Q_{PL}$ signals, respectively.

The LPFs 14 and 15 also have the same characteristics. This is because the $I_p$ and $Q_p$ signals have the same properties except that they are orthogonal to each other. Therefore, the LPFs 14 and 15 may be configured as a single filter.

The $I_p$ and $Q_p$ signals, which have passed through the LPFs 14 and 15, respectively, are inputted to the amplitude calculation section 18 as the $I_{PL}$ and $Q_{PL}$ signals. The amplitude calculation section 18 calculates an amplitude signal M from the $I_{PL}$ and $Q_{PL}$ signals. The amplitude signal M can be represented by (expression 8).

[Expression 8]

$$M = \sqrt{I_{PL}^2 + Q_{PL}^2} \quad \text{(expression 8)}$$

The amplitude signal M outputted by the amplitude calculation section 18 and the phase signal θ outputted by the signal generation section 10 are inputted to the control section 19. The control section 19 reads, from the LUT 20, a coefficient θcomp0 corresponding to the magnitude of the amplitude signal M, and calculates, based on the read coefficient θcomp0, a phase compensation amount θcomp corresponding to the amplitude signal M. Alternatively, the control section 19 may read, from the LUT 20, a coefficient θcomp0 corresponding to a value near the magnitude of the amplitude signal M, and may calculate a phase compensation amount θcomp corresponding to the amplitude signal M by interpolation from the read coefficient θcomp0. Hereinafter, coefficients θcomp0 stored in the LUT 20 will be described.

Figure 3A:
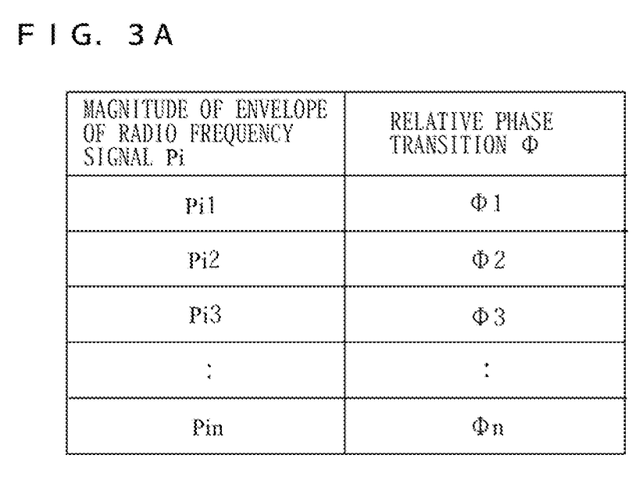
FIG. 3A shows an example of values of the relative phase transition $\Phi$ in an amplitude modulator 17.

FIG. 3A shows an example of values of the relative phase transition Φ in the amplitude modulator 17. As shown in FIG. 3A, as the magnitude of the envelope of the radio frequency signal Pi inputted to the amplitude modulator 17 varies from $P_i1$ to $P_in$, the relative phase transition Φ also varies from Φ1 to Φn. Here, n represents an arbitrary natural number.

Figure 3B:
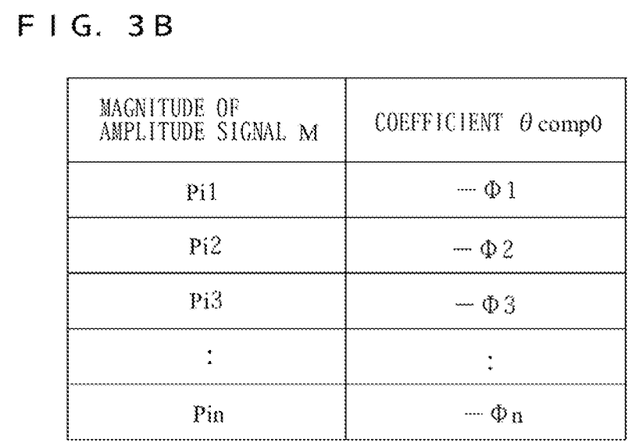
FIG. 3B shows an example of coefficients $\theta$comp0 stored in an LUT 20.

FIG. 3B shows an example of coefficients θcomp0 stored in the LUT 20. As shown in FIG. 3B, coefficients θcomp0 (−Φ1 to −Φn) corresponding to respective values (Pi1 to Pin) of the magnitude of the amplitude signal M outputted by the amplitude calculation section 18 are stored in the LUT 20 in advance. That is, the coefficients θcomp0 stored in the LUT 20 have characteristics opposite to those of the values described above of the relative phase transition Φ in the amplitude modulator 17.

The adder 21 adds, to the phase signal θ, an output signal from control section 19 (i.e., a phase compensation amount θcomp), and outputs the phase signal θ'. The phase signal θ' is as represented by (expression 6).

As described above, the compensation section 22 calculates the magnitude of a vector consisting of the $I_{PL}$ and $Q_{PL}$ signals which have passed through the LPFs 14 and 15 (i.e., the amplitude signal M), thereby predicting the variation of the envelope of the radio frequency signal Pi which occurs due to the $I_p'$ and $Q_p'$ signals passing through the LPFs 12 and 13. Then, the compensation section 22 calculates, based on the calculated amplitude signal M, a phase compensation amount θcomp (−Φ) for compensating for the relative phase transition Φ in the amplitude modulator 17, and adds the phase compensation amount θcomp to the phase signal θ. In this manner, the compensation section 22 compensates for AM/PM distortion contained in the transmission signal Po.

As described above, in the transmitter 1 according to the first embodiment of the present invention, the compensation section 22 compensates for AM/PM distortion contained in the transmission signal Po. Therefore, the transmitter 1 can operate with low distortion and high efficiency.

Figure 4:
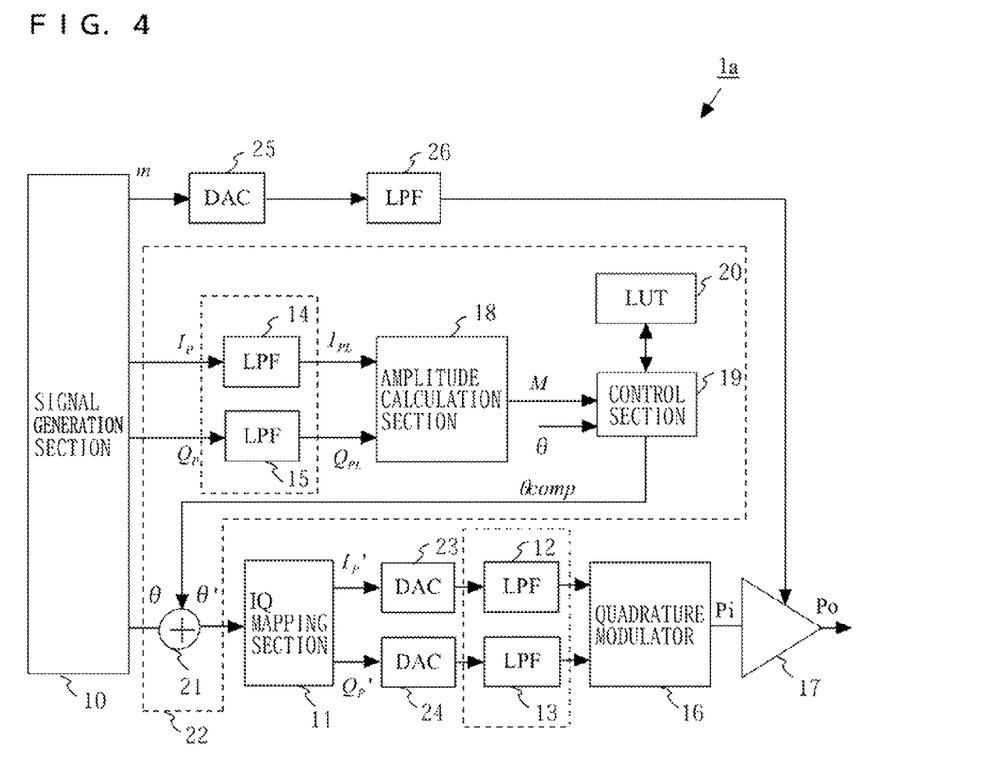
FIG. 4 is a block diagram showing an example of the configuration of a transmitter 1a according to the first embodiment of the present invention.

The transmitter 1 may further include DACs (digital to analog converters) 23 to 25, and an LPF 26, like a transmitter 1a shown in FIG. 4. The DACs 23 and 24 convert the $I_p'$ and $Q_p'$ signals outputted by the IQ mapping section 11 from digital to analog, respectively. The DAC 25 converts the amplitude signal m outputted by the signal generation section 10 from digital to analog. The LPF 26 removes an image signal from the amplitude signal m that is an analog signal.

Also, the compensation section 22 does not necessarily need to include the LUT 20, and the compensation section 22 may calculate a phase compensation amount θcomp, based on a predetermined calculation performed by the control section 19.

Second Embodiment

Figure 5:
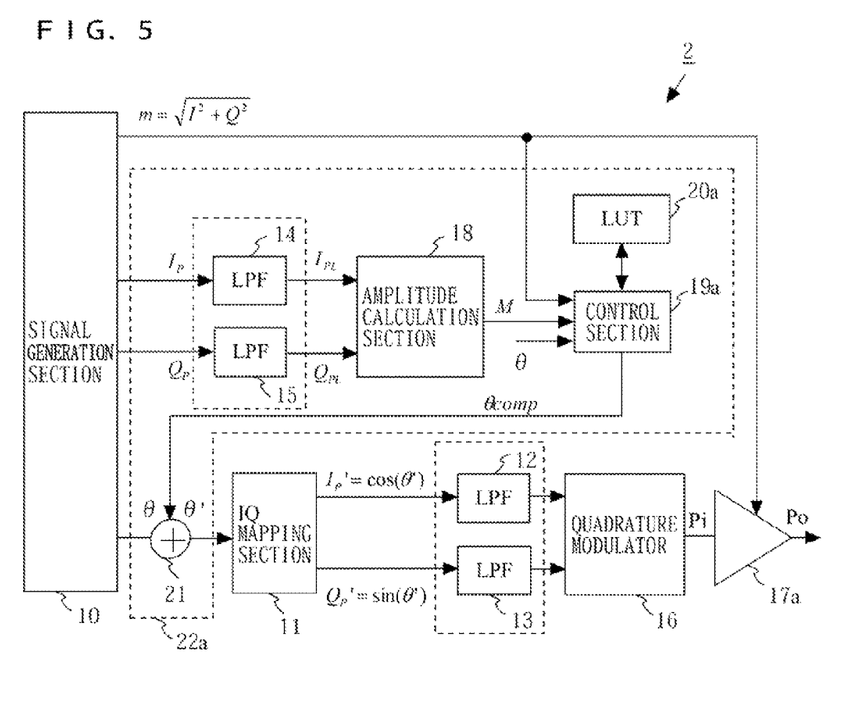
FIG. 5 is a block diagram showing an example of the configuration of a transmitter 2 according to a second embodiment of the present invention.

FIG. 5 is a block diagram showing an example of the configuration of a transmitter 2 according to a second embodiment of the present invention. The second embodiment shown in FIG. 5 takes into account the fact that the relative phase transition Φ in an amplitude modulator 17a varies depending on not only the magnitude of the envelope of the radio frequency signal Pi inputted to the amplitude modulator 17a, but also the magnitude of the amplitude signal m outputted by the signal generation section 10. The operation of a compensation section 22a in the transmitter 2 according to the second embodiment is different from that of the compensation section 22 in the first embodiment. Hereinafter, the operation of the compensation section 22a will be described.

Figure 6A:
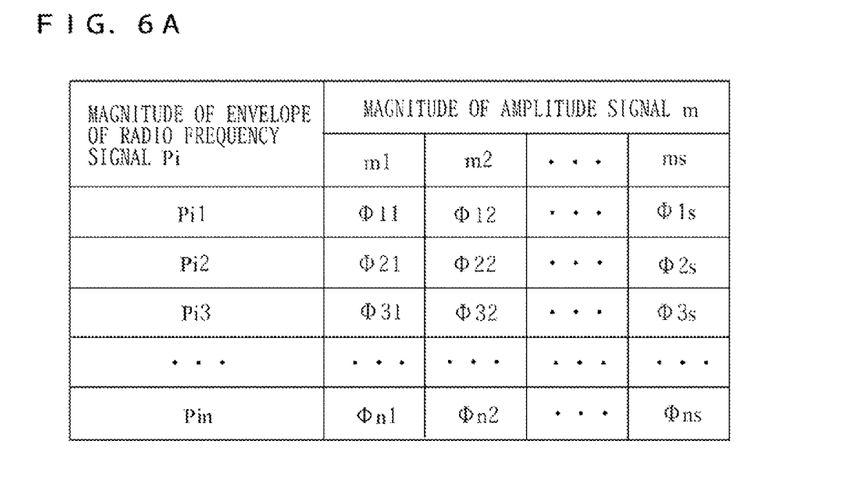

FIG. 6A shows an example of values of the relative phase transition Φ in the amplitude modulator 17a. As shown in FIG. 6A, the relative phase transition Φ in the amplitude modulator 17a varies depending on not only the magnitude of the envelope of the radio frequency signal Pi inputted to the amplitude modulator 17a, but also the magnitude of the amplitude signal m. For example, in the case where the magnitude of the amplitude signal m is m1, as the magnitude of the envelope of the radio frequency signal Pi varies from Pi1 to Pin, the relative phase transition Φ also varies from Φ11 to Φn1. In addition, in the case where the magnitude of the amplitude signal m is ms, as the magnitude of the envelope of the radio frequency signal Pi varies from Pi1 to Pin, the relative phase transition Φ also varies from Φ1s to Φns. It should be noted that n and s each represent an arbitrary natural number.

Figure 6B:
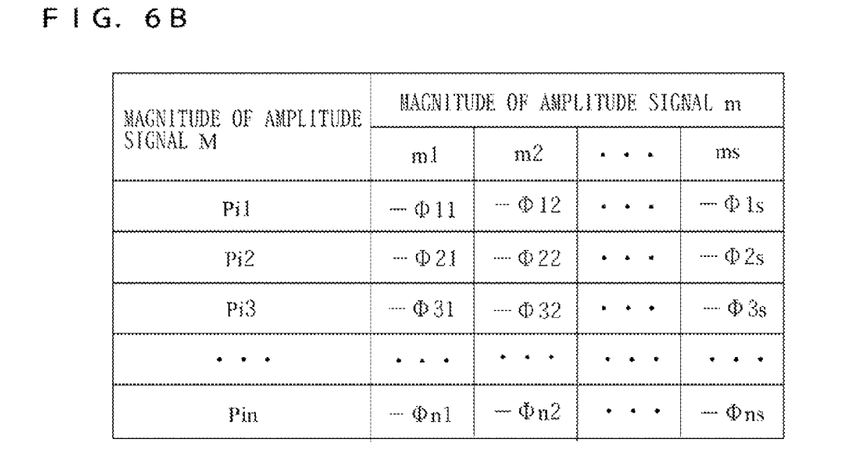

FIG. 6B shows an example of coefficients θcomp0 stored in an LUT 20a. As shown in FIG. 6B, coefficients θcomp0 (−Φ11 to −Φns) corresponding to values (Pi1 to Pin) of the magnitude of the amplitude signal M outputted by the amplitude calculation section 18 and values (m1 to ms) of the magnitude of the amplitude signal m, are stored in the LUT 20 in advance. That is, the coefficients θcomp0 stored in the LUT 20a have characteristics opposite to those of the values described above of the relative phase transition Φ in the amplitude modulator 17a.

In addition to the amplitude signal M outputted by the amplitude calculation section 18 and the phase signal θ outputted by the signal generation section 10, the amplitude signal m outputted by the signal generation section 10 is also inputted to a control section 19a. The control section 19a reads, from the LUT 20a, a coefficient θcomp0 corresponding to the magnitude of the amplitude signal M and the magnitude of the amplitude signal m, and calculates, based on the read coefficient θcomp0, a phase compensation amount θcomp corresponding to the amplitude signal M and the amplitude signal m. Alternatively, the control section 19a may read, from the LUT 20a, a coefficient θcomp0 corresponding to a value near the magnitude of the amplitude signal M and a value near the magnitude of the amplitude signal m, and may calculate a phase compensation amount θcomp corresponding to the amplitude signal M and the amplitude signal m by interpolation from the read coefficient θcomp0. Since the other operations in the present embodiment are the same as in the first embodiment, the description thereof is omitted.

As described above, the compensation section 22a calculates the magnitude of a vector consisting of the $I_{PL}$ and $Q_{PL}$ signals which have passed through the LPFs 14 and 15 (i.e., the amplitude signal M), thereby predicting the variation of the envelope of the radio frequency signal Pi which occurs due to the $I_p'$ and $Q_p'$ signals passing through the LPFs 12 and 13. Then, the compensation section 22a calculates, based on the calculated amplitude signal M and the amplitude signal m outputted by the signal generation section 10, a phase compensation amount θcomp (−Φ) for compensating for the relative phase transition Φ in the amplitude modulator 17a, and adds the phase compensation amount θcomp to the phase signal θ. In this manner, the compensation section 22a compensates for AM/PM distortion contained in the transmission signal Po.

As described above, in the transmitter 2 according to the second embodiment of the present invention, the compensation section 22a compensates for AM/PM distortion contained in the transmission signal Po. Therefore, the transmitter 2 can operate with low distortion and high efficiency. Further, as compared to the first embodiment, the transmitter 2 can compensate for AM/PM distortion contained in the transmission signal Po with higher precision even when the magnitude of the amplitude signal m varies to a great extent.

Figure 7:
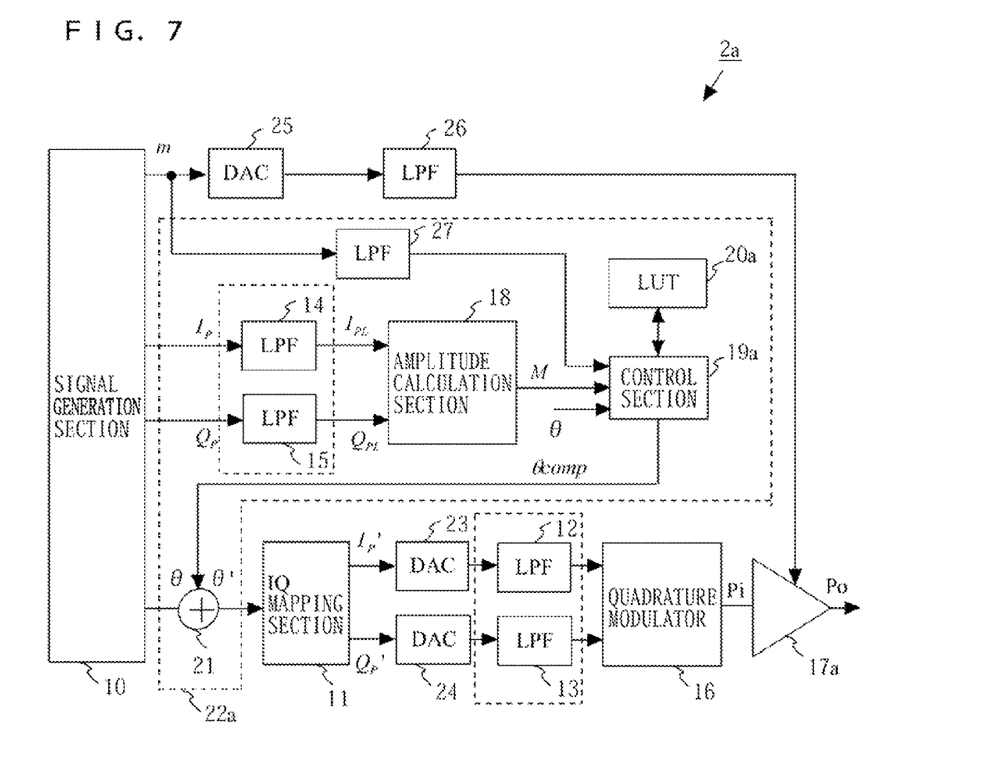
FIG. 7 is a block diagram showing an example of the configuration of a transmitter 2a according to the second embodiment of the present invention.

The transmitter 2 may further include DACs (digital to analog converters) 23 to 25, and LPFs 26 and 27, like a transmitter 2a shown in FIG. 7. The DACs 23 and 24 convert the $I_p'$ and $Q_p'$ signals outputted by the IQ mapping section 11 from digital to analog, respectively. The DAC 25 converts the amplitude signal m outputted by the signal generation section 10 from digital to analog. The LPF 26 removes an image signal from the amplitude signal m that is an analog signal. The LPF 27 removes quantization noise from the amplitude signal m that is a digital signal.

Third Embodiment

Figure 8:
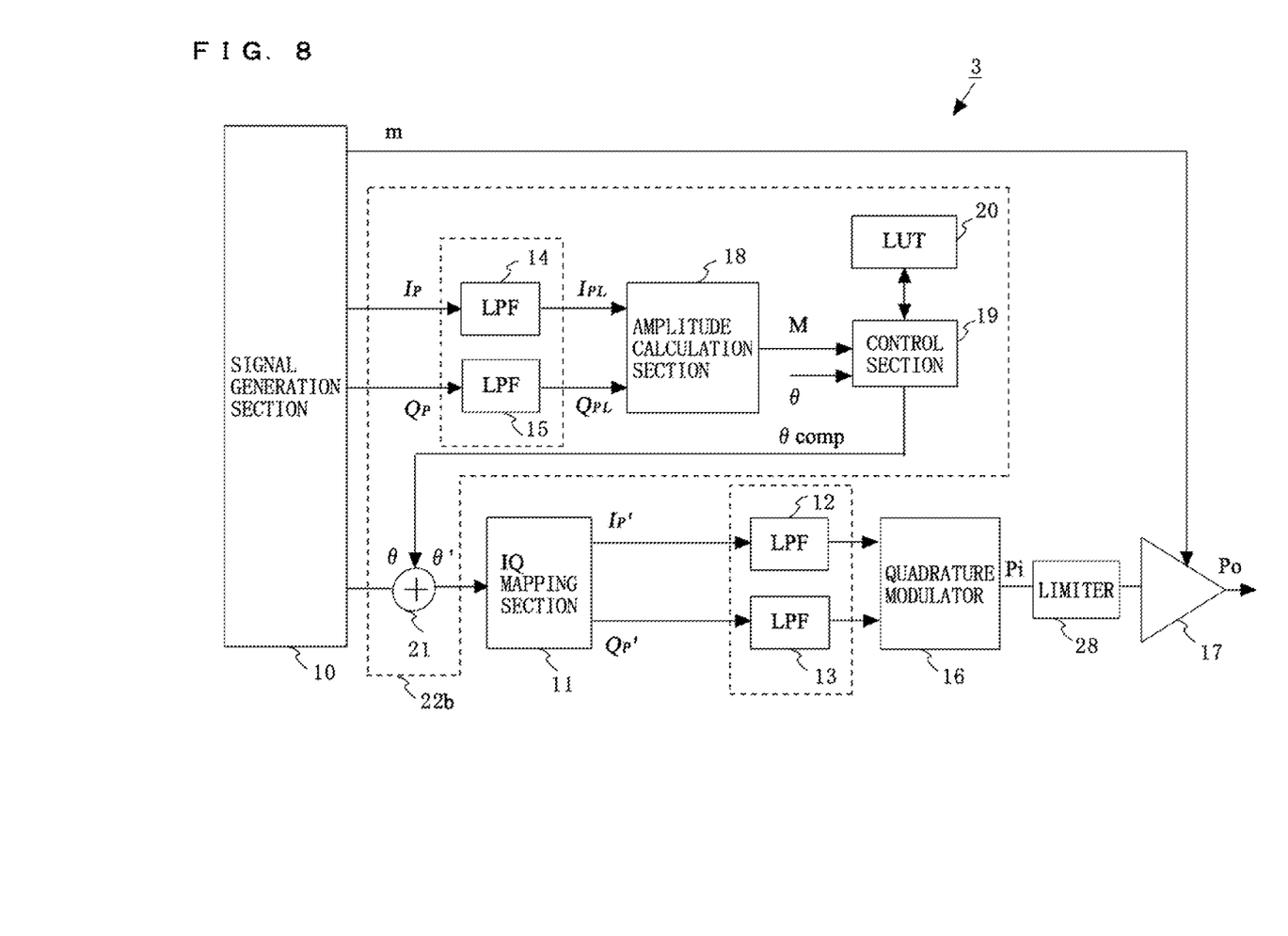
FIG. 8 is a block diagram showing an example of the configuration of a transmitter 3 according to a third embodiment of the present invention.

FIG. 8 is a block diagram showing an example of the configuration of a transmitter 3 according to a third embodiment of the present invention. As compared to the transmitter 1 according to the first embodiment, the transmitter 3 according to the third embodiment shown in FIG. 8 further includes a limiter 28 between the quadrature modulator 16 and the amplitude modulator 17. The limiter 28 functions to suppress the variation of the envelope of the radio frequency signal Pi outputted by the quadrature modulator 16.

A compensation section 22b compensates for AM/PM distortion in the limiter 28 instead of compensating for AM/PM distortion that occurs in the amplitude modulator 17. To be specific, the compensation section 22b calculates the magnitude of a vector consisting of the $I_{PL}$ and $Q_{PL}$ signals which have passed through the LPFs 14 and 15 (i.e., the amplitude signal M), thereby predicting the variation of the envelope of the radio frequency signal Pi which occurs due to the $I_p'$ and $Q_p'$ signals passing through the LPFs 12 and 13. Then, the compensation section 22b calculates, based on the calculated amplitude signal M, a phase compensation amount θcomp (−Φ) for compensating for AM/PM distortion in the limiter 28, and adds the phase compensation amount θcomp to the phase signal θ. In this manner, the compensation section 22b can compensate for AM/PM distortion contained in the transmission signal Po. Since the other operations in the present embodiment are the same as in the first embodiment, the description thereof is omitted.

In the transmitter 3 according to the third embodiment of the present invention which is as described above, the AM/PM characteristics are stable since the amplitude signal m is not inputted to the limiter 28, whereby better compensation can be achieved.

Figure 9:
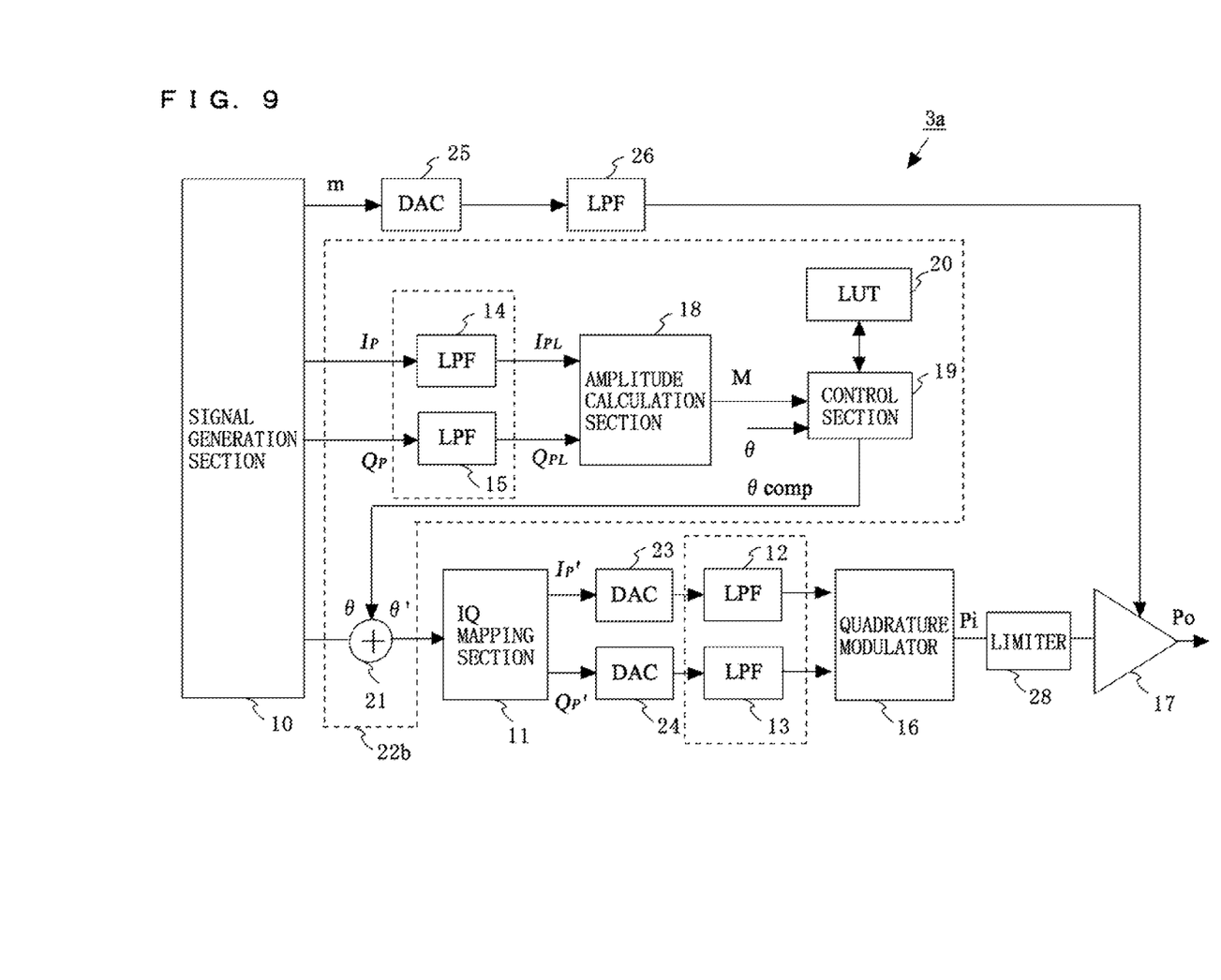
FIG. 9 is a block diagram showing an example of the configuration of a transmitter 3a according to the third embodiment of the present invention.

The transmitter 3 may further include DACs (digital to analog converters) 23 to 25, and an LPF 26, like a transmitter 3a shown in FIG. 9. The DACs 23 and 24 convert the $I_p'$ and $Q_p'$ signals outputted by the IQ mapping section 11 from digital to analog, respectively. The DAC 25 converts the amplitude signal m outputted by the signal generation section 10 from digital to analog. The LPF 26 removes an image signal from the amplitude signal m that is an analog signal.

The transmitter 1 according to the first embodiment is useful for a modulation method in which the variation of the amplitude signal m (i.e., the envelope of the transmission signal Po) is relatively small. Examples of a modulation method in which the variation of the amplitude signal m is small include communication methods such as GSM (Global System for Mobile Communications) and EDGE (Enhanced Data GSM Environment).

The transmitter 2 according to the second embodiment is useful for a modulation method in which the variation of the amplitude signal m (i.e., the envelope of the transmission signal Po) is relatively large. This is because AM/PM distortion increases as the variation of the amplitude signal m becomes large. Examples of a modulation method in which the variation of the amplitude signal m is large include methods such as UMTS (Universal Mobile Telecommunications System) and 3GLTE/WiMAX (3rd Generation Long Term Evolution/Worldwide Interoperability for Microwave Access).

Figure 10:
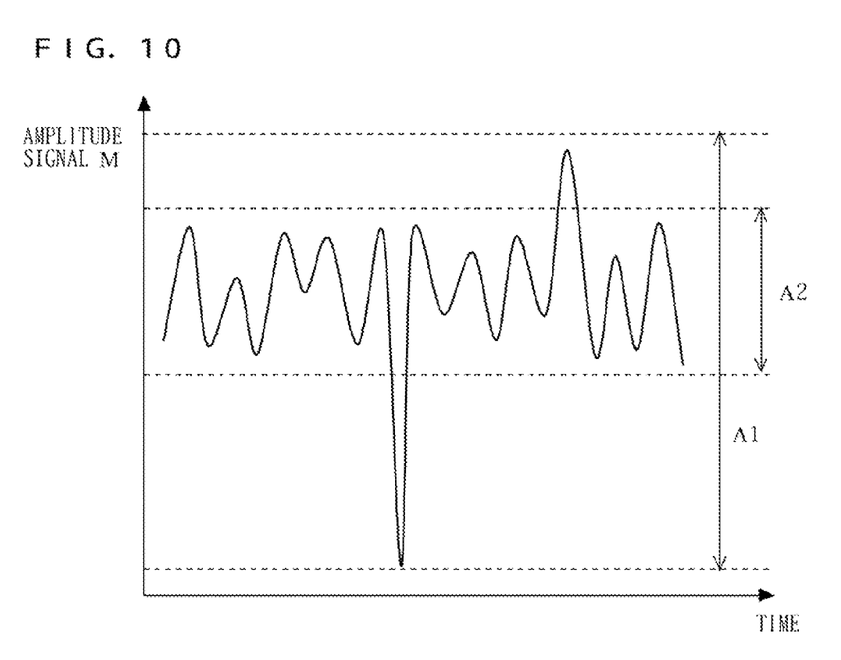
FIG. 10 shows an example of the time waveform of an amplitude signal M calculated by an amplitude calculation section 18.

Next, a description will be given of a method for setting the coefficients θcomp0 stored in the LUT 20 or 20a of the transmitters according to the first to third embodiments. FIG. 10 shows an example of the time waveform of the amplitude signal M calculated by the amplitude calculation section 18. A first method is to set, as shown in FIG. 10, the coefficients θcomp0 in the LUT 20 or 20a over the entire range in which the magnitude of the amplitude signal M varies (i.e., the range indicated by A1). According to the first method, although the memory size of the LUT 20 or 20a increases, it is possible to perform detailed control.

A second method is to set the coefficients θcomp0 only for the range of values of the magnitude of the amplitude signal M that exist at a probability higher than or equal to a predetermined probability (i.e., the range indicated by A2). When the magnitude of the amplitude signal M is out of the range indicated by A2, a coefficient θcomp0 that corresponds to a value nearest to the magnitude of the amplitude signal M may be used. The second method makes it possible to reduce the memory size of the LUT 20 or 20a.

Fourth Embodiment

Figure 11:
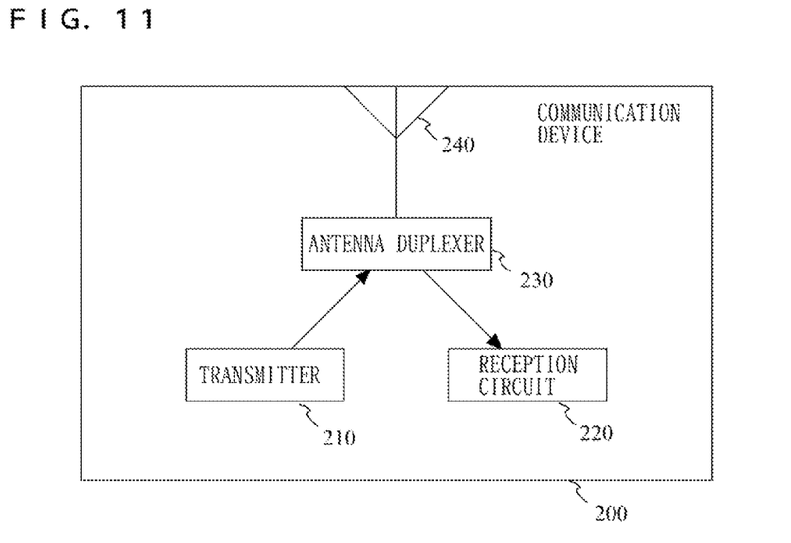
FIG. 11 is a block diagram showing an example of the configuration of a communication device 200 according to a fourth embodiment of the present invention.

FIG. 11 is a block diagram showing an example of the configuration of a communication device 200 according to a fourth embodiment of the present invention. Referring to FIG. 9, the communication device 200 according to the fourth embodiment includes a transmitter 210, a reception circuit 220, an antenna duplexer 230, and an antenna 240. One of the transmitters according to the first to third embodiments described above is used as the transmitter 210. The antenna duplexer 230 transmits, to the antenna 240, a transmission signal outputted from the transmitter 210, and prevents the transmission signal from leaking into the reception circuit 220. Further, the antenna duplexer 230 transmits, to the reception circuit 220, a reception signal inputted from the antenna 240, and prevents the reception signal from leaking into the transmitter 210.

In this manner, the transmission signal is outputted from the transmitter 210, and emitted into space from the antenna 240 via the antenna duplexer 230. Meanwhile, the reception signal is received by the antenna 240, and then received by the reception circuit 220 via the antenna duplexer 230. The communication device 200 according to the fourth embodiment uses one of the transmitters according to the first to third embodiments, thereby securing the linearity of the transmission signal and realizing low distortion as a wireless device. In addition, since the communication device 200 does not include any branch such as a directional coupler at the output of the transmitter 210, it is possible to reduce the loss on the path from the transmitter 210 to the antenna 240, and thus possible to reduce the power consumption at the time of transmission. Accordingly, the communication device 200 can be used for a long period of time as a radio communication device. Further, since in the communication device 200, the transmitter 210 reduces noise contained in a bandwidth that overlaps a reception bandwidth, it is possible to prevent noise, which occurs in the transmitter 210, from adversely affecting the reception quality of the reception circuit 220. The communication device 200 may include only the transmitter 210 and the antenna 240.

The transmitter according to the present invention is applicable to communication devices and the like, such as mobile phones and wireless LAN devices.

| DESCRIPTION OF THE REFERENCE CHARACTERS | |
|---|---|
| 1 to 3 | transmitter |
| 10 | signal generation section |
| 11 | IQ mapping section |
| 12 to 15, 26, 27 | LPF |
| 16 | quadrature modulator |
| 17 | amplitude modulator |
| 18 | amplitude calculation section |
| 19, 19a | control section |
| 20, 20a | LUT |
| 21 | adder |
| 22, 22a, 22b | compensation section |
| 23 to 25 | DAC |
| 28 | limiter |
| 101, 102 | signal conversion section |
| 200 | communication device |
| 210 | transmitter |
| 220 | reception circuit |
| 230 | antenna duplexer |
| 240 | antenna |

The invention claimed is:

1. A transmitter which outputs a transmission signal, the transmitter comprising:
a signal generation section for performing predetermined signal conversion processing on an input signal, and generating first I and Q signals, a phase signal representing a phase component of the input signal, and a first amplitude signal representing a magnitude of the input signal;
an IQ mapping section for converting the phase signal into second I and Q signals;
a first low-pass filter (LPF) for removing a spurious component from the second I and Q signals;
a quadrature modulator for performing quadrature modulation on the second I and Q signals inputted via the first LPF, and outputting a radio frequency signal;
an amplitude modulator for performing amplitude modulation on the radio frequency signal with the first amplitude signal, and outputting the transmission signal; and
a compensation section for compensating for amplitude modulation/phase modulation (AM/PM) distortion contained in the transmission signal, based on the first I and Q signals,
wherein the compensation section includes:
a second low-pass filter (LPF) having the same characteristics as those of the first LPF for receiving the first I and Q signals, predicting a variation of an output caused by the first LPF, and removing a spurious component from the first I and Q signals;
an amplitude calculation section for calculating a second amplitude signal representing a magnitude of the first I and Q signals inputted via the second LPF;
a look-up table (LUT) in which a coefficient corresponding to the magnitude of the second amplitude signal is stored in advance;
a control section for reading, from the LUT, the coefficient corresponding to the magnitude of the second amplitude signal, and calculating, based on the read coefficient, a phase compensation amount corresponding to the second amplitude signal; and
an adder for adding the phase compensation amount to the phase signal.

2. The transmitter according to claim 1, wherein the control section reads, from the LUT, a coefficient corresponding to a value near the magnitude of the second amplitude signal, and calculates the phase compensation amount corresponding to the second amplitude signal by interpolation from the read coefficient.

3. The transmitter according to claim 1, wherein a coefficient having a characteristic opposite to that of a relative phase transition in the amplitude modulator is stored in the LUT.

4. The transmitter according to claim 3, wherein a coefficient corresponding to the magnitude of the first amplitude signal and the magnitude of the second amplitude signal is stored in the LUT.

5. The transmitter according to claim 4, wherein the control section reads, from the LUT, the coefficient corresponding to the magnitude of the first amplitude signal and the magnitude of the second amplitude signal, and calculates, based on the read coefficient, the phase compensation amount corresponding to the first amplitude signal and the second amplitude signal.

6. The transmitter according to claim 5, wherein the control section reads, from the LUT, a coefficient corresponding to a value near the magnitude of the first amplitude signal and a value near the magnitude of the second amplitude signal, and calculates the phase compensation amount corresponding to the first amplitude signal and the second amplitude signal by interpolation from the read coefficient.

7. The transmitter according to claim 1, wherein
the signal generation section includes:
a first signal conversion section for converting the input signal into the phase signal and the first amplitude signal; and
a second signal conversion section for converting the phase signal into the first I and Q signals, and
when the input signal is denoted by I and Q, the phase signal is denoted by θ, the first I and Q signals are denoted by $I_p$ and $Q_p$, and the first amplitude signal is denoted by m, the relationships represented by the following expressions are satisfied among I, Q, $\theta$, $I_p$, $Q_p$, and m $$\theta = \arctan\left(\frac{Q}{I}\right)$$
$$I_p = \cos(\theta)$$
$$Q_p = \sin(\theta)$$
$$m = \sqrt{I^2 + Q^2}.$$

8. The transmitter according to claim 1, further comprising a limiter for suppressing variation of the envelope of the radio frequency signal, the limiter being provided between the quadrature modulator and the amplitude modulator.

9. A communication device comprising:
 a transmitter for generating a transmission signal; and
 an antenna for outputting the transmission signal generated by the transmitter, wherein the transmitter is the transmitter according to claim 1.

10. The communication device according to claim 9, further comprising:
 a reception circuit for processing a reception signal received from the antenna; and
 an antenna duplexer for outputting, to the antenna, the transmission signal generated by the transmitter, and outputting, to the reception circuit, the reception signal received from the antenna.

11. The transmitter according to claim 1, wherein the compensation section
 calculates the magnitude of a vector consisting of I and Q signals which have passed through the second LPF as the amplitude signal M, thereby predicting a variation of an envelope of a radio frequency signal which occurs due to the I and Q signals passing through the first LPF,
 calculates, based on the calculated amplitude signal M, a phase compensation amount for compensating for a relative phase transition in the amplitude modulator, and
 adds the phase compensation amount to the phase signal.

* * * * *